Dec. 29, 1964 P. J. LE MIEUX 3,163,568

METHOD OF TREATING SEMICONDUCTOR DEVICES

Filed Feb. 15, 1961

INVENTOR.
PIERRE J. LeMIEUX
BY David M. Keay
AGENT.

United States Patent Office 3,163,568
Patented Dec. 29, 1964

3,163,568
METHOD OF TREATING SEMICONDUCTOR DEVICES

Pierre J. Le Mieux, Watertown, Mass., assignor to Sylvania Electric Products Inc., a corporation of Delaware Filed Feb. 15, 1961, Ser. No. 89,478
4 Claims. (Cl. 156—17)

Figures 1, 2:
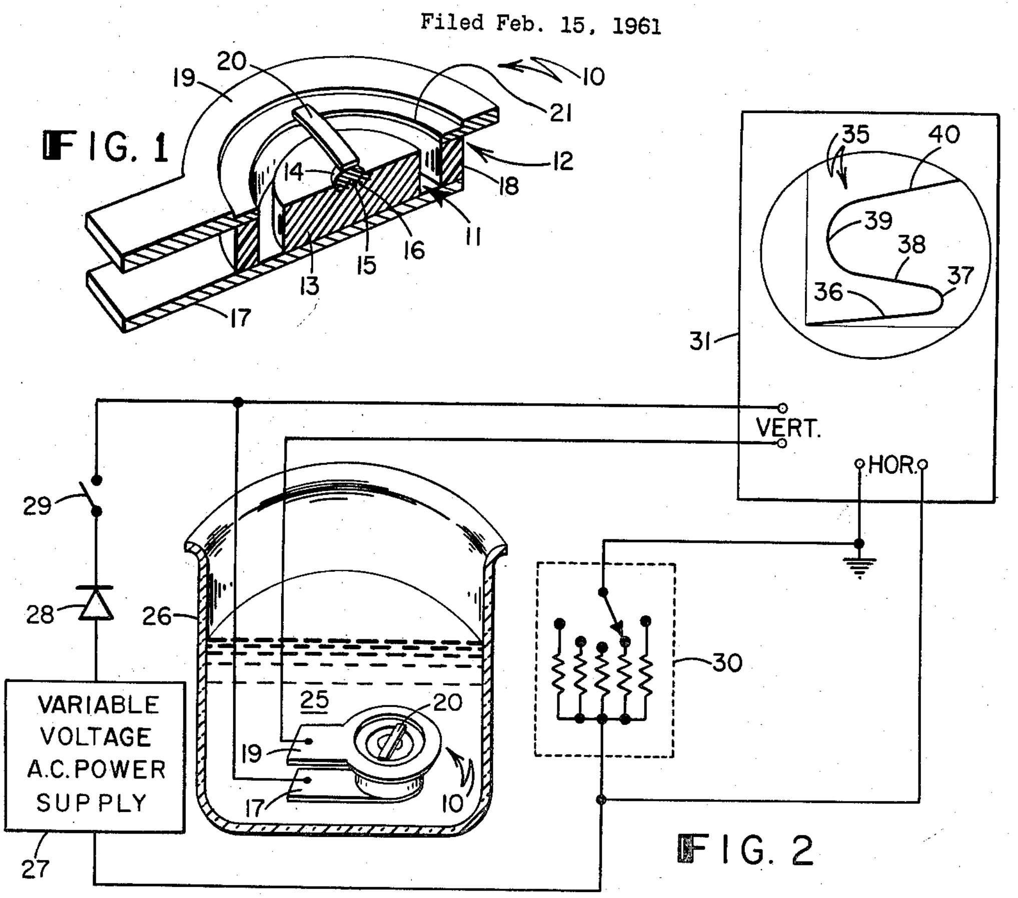

This invention relates to the manufacture of semiconductor devices. More particularly, it is concerned with a method of treating alloyed junction semiconductor devices in order to reduce the area of the junction.

An alloyed junction semiconductor device is commonly fabricated from a body of semiconductor material of one conductivity type by alloying to the body an electrode in the form of a pellet containing material capable of imparting the opposite type of conductivity to the semiconductor material. A P–N junction is formed between the bulk of the body of semiconductor material and the recrystallized zone containing conductivity type imparting material from the pellet. Any short circuit which may form across the exposed edges of the junction during alloying is generally removed by any of various well-known etching techniques. The junction remaining is capable of providing rectification in a known manner. The electrical characteristics of an alloyed junction device are affected by the nature of the rectifying connection formed during the alloying step and subsequent etching, and one of the significant factors is the area of the P–N junction.

In one type of alloyed junction semiconductor device which is known as the tunnel diode the area of the junction is particularly significant. The internal capacitance of the device is directly proportional to the junction area, and the internal capacitance is the characteristic which determines the maximum operating frequency of the device. Thus, it is desirable to provide tunnel diodes with small area junctions in order to obtain satisfactory operation at high frequencies. However, since the current carrying capacity of the device is directly proportional to the junction area, the junction must be large enough to permit a satisfactory level of current flow through the device.

Tunnel diodes are etched in various known manners in order to remove any short circuit at the exposed edges of the junction and further reduce the area of the junction. Various etching solutions and techniques are employed, including acid solutions, peroxide solutions, electrolytic techniques, and jet-etching techniques. Preferential etching techniques are also known which remove material from the region of the junction at a more rapid rate that it is removed from other portions of the device. Some of the known solutions and techniques require that the etching process be carried out at elevated temperatures in order to obtain reasonable rates of etching, and others require elaborate equipment. After the etching treatment has been performed, electrical measurements of each device must be made and the device re-treated if the characteristics have not yet attained the desired values. Of course, if the characteristics of a device are not satisfactory because the device has been overetched, no further processing can correct the characteristics and the device generally must be discarded.

It is an object of the present invention, therefore, to provide an improved method of treating alloyed junction semiconductor devices.

It is a more specific object of the invention to provide an improved method of reducing the area of the junction of an alloyed junction semiconductor device in a controlled manner.

Briefly, in accordance with the objects of the invention a semiconductor device including a body of semiconductor material and an electrode having a conductivity type imparting material forming an alloyed connection to the semiconductor body is treated by immersing the exposed portion of the connection in a substantially nonconducting etching solution and passing electrical current across the connection. The flow of electrical current is monitored and the treatment is stopped when the flow of current attains a predetermined condition.

It is a feature of the invention to immerse the alloyed connection in an etching solution which is substantially nonconducting and which dissolves the semiconductor material at a rate which increases with an increase in temperature.

It is also a feature of the invention to pass electrical current across the alloyed connection sufficient to generate heat in the region of the connection and thereby increase the temperature of the etching solution adjacent the connection. Preferential etching in the region of the connection is thus obtained.

Figure 4:
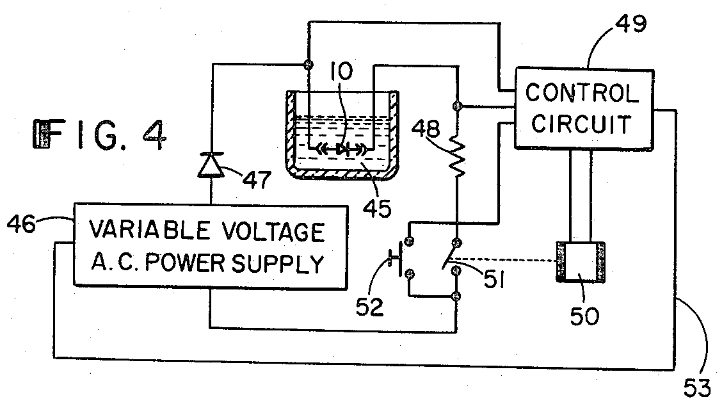
Figure 3:
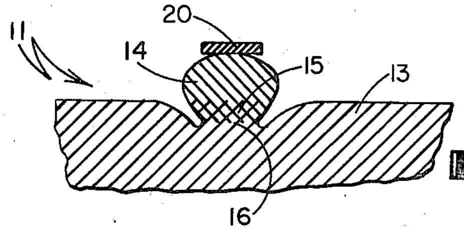

Additional objects, features, and advantages of the method of the invention will be apparent from the following detailed discussion and the accompanying drawings wherein:

FIG. 1 is a perspective view in cross section illustrating an alloyed junction tunnel diode prior to being treated according to the method of the invention, FIG. 2 is a schematic representation illustrating a tunnel diode being treated according to the method of the invention and including a circuit diagram of the electrical apparatus employed, FIG. 3 is a representation of a portion of a tunnel diode in cross section illustrating the alloyed junction subsequent to treatment of the device according to the method of the invention, and FIG. 4 is a circuit diagram of a modification of the apparatus of FIG. 2 which provides automatic control of the treatment of the diode.

In the figures illustrating the tunnel diode certain dimensions are exaggerated in relation to other dimensions in order to present a clearer understanding of the invention.

The alloyed junction semiconductor device 10 illustrated in FIG. 1 is a tunnel diode having electrically active elements 11 supported in a mounting 12. The electrically active elements include a cylindrical body 13 of a semiconductor material of one conductivity type and an electrode 14 which contains a material capable of imparting the opposite type of conductivity to the semiconductor material, alloyed to the body. Illustratively, the semiconductor body may be of P-type germanium and the electrode contain N-type conductivity imparting material. The electrode material is alloyed into the germanium body to form, upon cooling, a re-crystallized region 15 of N-type germanium. This region forms with the P-type region of the bulk of the body a P–N junction 16.

The mounting 12 for the electrically active elements includes a metal plate 17 on which the germanium body 13 is mounted to provide an ohmic base contact. A ceramic ring 18 metallized on its upper and lower surfaces is attached to the plate and a metal tab 19 is mounted on top of the ceramic. The mounting plate and tab are both gold-plated in order to resist the actions of etching solutions. A gold strip 20 is fastened to the metal tab 19 at opposite sides of a central opening 21 in the tab and also makes ohmic contact at its center to the electrode 14.

In treating a tunnel diode of the type illustrated in FIG. 1 in order to remove any short circuit at the junction and to reduce the area of the junction, the exposed portion of the junction is immersed in a substantially nonconducting etching solution. As shown in FIG. 2, the junction may be immersed by submerging the entire diode 10 in the etching solution 25 which is contained in a vessel 26. An aqueous solution of hydrogen peroxide, which is commonly used for etching semiconductor materials, has been found particularly suitable for etching germanium devices in accordance with the method of the invention. Electrical contact is made to the base mounting plate 17 and to the tab 19 of the device in order to connect the diode into the circuit. The diode is connected in series with a variable voltage A.C. power supply 27, a rectifier 28, a switch 29, and a set of standard current reading resistances 30. The vertical deflection plates of a cathode ray oscilloscope 31 are connected across the diode and the horizontal deflection plates are connected across the set of current reading resistances.

When power is supplied to the diode by closing the switch 29, a series of positive half-cycle pulses are applied across the diode by the power supply 27 and series connected rectifier 28. Since the diode is immersed in a substantially nonconducting etching solution, there is very little electrical loss through the solution and nearly all of the current flow in the circuit passes through the diode. The positive-going portion of each of the half sine wave pulses applied to the diode provides a continuously varying voltage across the diode, thus permitting a continuous trace of the forward conduction characteristics of the diode to be displayed on the face of the cathode ray tube. With the oscilloscope connections as shown in FIG. 2, current through the diode is traced along the horizontal scale and voltage across the diode along the vertical scale.

After any short circuit which may exist across the junction has been removed by etching action, the curve 35 of the forward voltage-current characteristics of the diode appears as represented on the oscilloscope 31 in FIG. 2. The first portion 36 of the curve illustrates the positive resistance characteristic of the diode until a peak tunneling current 37 is reached. The device next exhibits a negative resistance region 38 until a low current point 39 is reached. Then a positive resistance characteristic 40 is again exhibited. The first positive resistance region and the negative resistance region are caused by the so-called tunneling effect. The second positive resistance region is the typical forward conduction characteristic generally exhibited by all types of semiconductor diodes, and is not due to tunneling action. The ratio between the peak current 37 and the low current 39 is one of the significant electrical parameters of a tunnel diode. The peak current 37 is the maximum tunneling current which can flow across the junction of a diode and it is directly proportional to the area of the junction. During the retrace or negative-going portion of the half-cycle wave applied to the diode, the curve falls along the trace of the positive-going portion except in regions which are clearly distinguishable from the original trace, and no confusion is caused with the positive-going curve which is illustrated in FIG. 2.

Current flow across the P–N junction generates heat at the junction. The current in the ordinary diode forward conduction portion 40 of the characteristic curve is permitted to become very high (well beyond the highest value which would show in the oscilloscope trace in FIG. 2) by the selection of a suitable output voltage from the power supply 27. The high forward current generates a great amount of heat at the junction which would burn out the diode if it were not for the absorption of heat by the etching solution surrounding the junction. The etching solution adjacent the region of the junction thus becomes heated, and since the dissolving action of the solution increases with temperature, the exposed edges of the junction are etched at a more rapid rate than other portions of the diode exposed to the solution.

As the etching action continues, the area of the junction and consequently the peak tunneling current across the junction decrease. The progress of this action may be followed on the oscilloscope by switching through the set of standard current reading resistors 30 so that the value of the peak current 37 may be read accurately. As the peak current changes, the ratio between the peak current 37 and the low current 39 generally remains nearly constant. In order to prevent the junction from becoming overheated and burning out as its area decreases, the power supply voltage is reduced as the etching action progresses. This procedure also prevents the etching rate from becoming excessive and difficult to control as the junction area becomes very small. When the peak current has been reduced to the desired value, the switch 29 is opened. Since electrical current no longer flows across the junction, heat is no longer generated at the junction and the etching solution adjacent the region of the junction rapidly cools to that of the surrounding solution. Thus, the etching action is reduced to its rate at room temperature and may be considered as effectively stopped. The diode is then removed from the etching solution and rinsed in accordance with known techniques to remove all traces of the etching solution.

A portion of the active elements of the diode 11 upon completion of the selective etching treatment according to the foregoing method is illustrated in FIG. 3. Since the junction region of the junction 16 has been etched at a much greater rate than the remainder of the germanium body 13 and the electrode 14, the electrode and the N-type re-crystallized region 15 have been undercut in the manner indicated. The diode mounting 12 is generally sealed at this stage as by placing a cover plate (not shown) over the opening 21 in the tab 19 and welding it to the upper rim of the tab.

FIG. 4 illustrates a modification of the apparatus of FIG. 2 by which the method of the invention may be carried out automatically. The exposed P–N junction is immersed in etching solution by submerging the diode 10 in the solution 45. The diode is connected in series with a variable voltage A.C. power supply 46, a rectifier 47, and a sensing resistance 48. A control circuit 49 which has input connections across the diode and across the sensing resistance 48 monitors the peak tunneling current through the diode by periodically sampling the conduction characteristics. The control circuit operates to supply current above a minimum level to its output circuit, which includes a relay 50, as long as the peak current through the diode remains above a predetermined value. The normally-open contacts 51 of the relay are connected in series with the diode 10 and the power supply 46, and are shunted by a normally-open push-button switch 52. The control circuit also monitors the voltage across the sensing resistance 48, which decreases as the area of the junction decreases, in order to provide a control signal to the power supply over a connection 53 which continually reduces the output voltage of the power supply as the etching action progresses.

In treating a diode in the apparatus of FIG. 4, the diode is submerged in the etching solution and the pushbutton switch 52 is closed. Current flows through the diode and the etching action as the junction starts. Since the peak current as detected by the control circuit 49 is high, current flows through the relay 50 sufficient to close the relay contacts 51. The push-button switch must be held closed either manually or by means of a time delay arrangement until the relay contacts close.

When the area of the junction of the diode has been reduced so that the peak current falls below the predetermined value as set in the control circuit 49, the current in the output circuit of the control circuit falls below the level required to maintain the relay 50 closed. The relay contacts 51 open stopping the flow of current through the diode and effectively stopping the etching action as explained hereinabove. A suitable warning device, such as a signal light, may be incorporated with the control circuit output circuit to give visual indication that the etching has been completed. If desired, the apparatus may also include an arrangement for bodily removing the diode from the etching solution when the predetermined peak current has been reached.

In a typical example employing the method of the invention, tunnel diodes similar to the type of FIG. 1 were treated in apparatus of the type illustrated in FIG. 2. Each diode was comprised of a cylinder 13 of single crystal P-type germanium 35 mils in diameter and 20 mils thick. The germanium contained gallium as a conductivity type imparting material and was $8 \times 10^{-4}$ ohm-centimeters resistivity. The electrodes 14 were applied to the germanium cylinders in the form of 2 mil diameter spheres which were 95% tin and 5% arsenic. They were alloyed to the cylinders at a temperature of 510° C. for a period of 5 seconds. Junctions 16 having diameters of between 1 and 1.5 mils were thereby formed between the electrodes and the bodies of germanium. Each set of active elements 11 comprising a cylinder and its alloyed electrode was then mounted in a mounting 12 as shown in FIG. 1. Each mounting plate 17 and tab 19 was of gold-clad Kovar and each of the ceramic rings 18 was of alumina. A strip of gold 20 was welded to opposite sides of the opening 21 in the tab 19 and to the top of the electrode of each device.

Suitable electrical contacts were made to the base mounting plate 17 and tab 19 of each diode and it was submerged in an aqueous solution of 30% by weight hydrogen peroxide. Circuit connections were then made between the diode and the circuit as illustrated in FIG. 2, and current was permitted to flow through the circuit by closing the switch 29. The variable voltage power supply 27 provided up to 10 volts at a frequency of 60 cycles per second. The peroxide solution was substantially nonconducting and very little electrical leakage occurred around the junction. Current flow across the junction heated the junction causing the temperature of the peroxide solution adjacent the region of the junction to be raised to approximately 80° C. The absorption of heat from the junction by the surrounding etching solution prevented the diode from burning out. In addition, the increased temperature of the solution at the exposed junction caused the etching action in the region of the junction to be effective and dissolve germanium. The dissolving action of the peroxide solution on germanium increases with temperature at an exponential rate. At a temperature of 80° C. the dissolving rate approaches six times the rate at room temperature, and at 100° C. the rate is more than eight times the rate at room temperature. The peroxide solution has substantially no effect on the electrode which is primarily of tin.

The initial peak current readings for the diodes as measured on the oscilloscope were from 135 to 150 milliamperes after the short circuits of the junctions had been removed by etching action. The ratios of the peak currents 37 to the low currents 39 were between 8 to 1 and 10 to 1. The etching treatment of each device was monitored on the oscilloscope and was continued until the peak current which could flow through the junction was approximately 5 millamperes. During the treatment the output voltage of the power supply was periodically reduced in order to prevent burn-out and excessively rapid etching. When the peak current became 5 milliamperes the current in the circuit was turned off, thus effectively stopping the etching action; and the diode was removed from the peroxide solution and rinsed in alcohol. The period of time for treating the diodes varied from 2 to 5 minutes depending on the initial area of the junction. The ratios of peak to low current were substantially unchanged for each device. Diodes treated in this manner were found to have a junction area of about 0.5 mil in diameter. The capacitances of the diodes were of the order of 5 micromicrofarads.

What is claimed is:

1. In the manufacture of a semiconductor device including a body of semiconductor material and an electrode having a conductivity type imparting material forming an alloyed rectifying connection thereto, the steps of immersing the exposed portion of the connection in a substantially non-conducting etching solution which is capable of dissolving the material of the body of semiconductor material at a rate which increases with an increase in temperature, passing an electrical current across the immersed connection sufficient to generate heat in the region of the connection and continuously monitoring the flow of electrical current, and stopping the flow of current when the flow of current attains a predetermined condition.

2. The method of reducing the area of the rectifying connection between a body of semiconductor material of one conductivity type and an electrode capable of imparting the opposite type of conductivity to the semiconductor material, including the steps of immersing the exposed portion of the connection in a substantially nonconducting etching solution capable of dissolving the semiconductor material at an elevated temperature, passing an electrical current across the immersed rectifying connection between the electrode and the body of the semiconductor material sufficient to raise the temperature in the region of the connection whereby the etching solution dissolves semiconductor material in the region of the connection, continuously monitoring the flow of current while the etching solution dissolves material, and stopping the flow of current when the flow of current attains a predetermined value because of reduction of the area of the rectifying connection, thereby reducing the temperature in the region of the connection and consequently the dissolving action thereat.

3. The method of reducing the area of the rectifying junction in a tunnel diode including a body of semiconductor material of one conductivity type having an electrode capable of imparting the opposite type of conductivity alloyed thereto, including the steps of immersing the exposed portion of the junction in a substantially nonconducting etching solution which is capable of dissolving the material of the body of semiconductor material at a rate which increases with an increase in temperature, applying a series of electrical pulses across the immersed junction between the electrode and the body of semiconductor material, the electrical pulses causing sufficient current to flow across the junction to generate heat in the region of the junction and raise the temperature of the etching solution adjacent said region, continuously monitoring the peak tunneling current which flows across the junction during each electrical pulse, and stopping the series of electrical pulses when the peak tunneling current is reduced to a predetermined value because of the reduction of the area of the rectifying junction, thereby reducing the temperature and the resultant dissolving action at the junction.

4. The method of reducing the area of the rectifying junction in a tunnel diode including a body of germanium of one conductivity type having an electrode capable of imparting the opposite type of conductivity alloyed thereto, including the steps of immersing the exposed portion of the junction in an aqueous hydrogen peroxide etching solution, applying a series of varying voltage pulses across the immersed junction between the electrode and the body of germanium, the voltage of the pulses being sufficiently high that current flow across the junction generates heat in the region of the junction and raises the temperature of the etching solution adjacent said region, continuously monitoring the peak tunneling current which flows across the junction during each voltage pulse, and stopping the series of pulses when the peak tunneling current is reduced to a predetermined value because of the reduction of the area of the rectifying junction, thereby reducing the temperature and the resultant dissolving action at the junction.

(References on following page)

References Cited in the file of this patent

UNITED STATES PATENTS

| | | |
|---|---|---|
| 2,364,501 | Wolfskill | Dec. 5, 1944 |
| 2,577,803 | Pfann | Dec. 11, 1951 |
| 3,001,112 | Murad | Sept. 19, 1961 |
| 3,033,714 | Esaki et al. | May 8, 1962 |
| 3,054,709 | Freestone et al. | Sept. 18, 1962 |
| 3,081,418 | Manintveld et al. | Mar. 12, 1963 |
| 3,088,888 | Leff | May 7, 1963 |
| 3,110,849 | Soltys | Nov. 10, 1963 |

OTHER REFERENCES

Beliveau et al.: Etching PN Junctions, IBM Disclosure Bulletin, volume 2, No. 3, October 1929, pages 64–65.

Davis: Etching Esaki Diodes, IBM Disclosure Bulletin, volume 3, No. 9, February 1961, pp. 26–27.